(12) United States Patent
Yang et al.

(10) Patent No.: US 11,227,792 B2
(45) Date of Patent: Jan. 18, 2022

(54) INTERCONNECT STRUCTURES INCLUDING SELF ALIGNED VIAS

(71) Applicant: International Business Machines Corporation, Armonk, NY (US)

(72) Inventors: Chih-Chao Yang, Glenmont, NY (US); Terry A. Spooner, Mechanicville, NY (US); Koichi Motoyama, Clifton Park, NY (US); Shyng-Tsong Chen, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 62 days.

(21) Appl. No.: 16/576,712

(22) Filed: Sep. 19, 2019

(65) Prior Publication Data

US 2021/0090942 A1 Mar. 25, 2021

(51) Int. Cl.
*H01L 21/768* (2006.01)
*H01L 23/522* (2006.01)
*H01L 23/528* (2006.01)

(52) U.S. Cl.
CPC .. *H01L 21/76802* (2013.01); *H01L 21/76877* (2013.01); *H01L 23/528* (2013.01); *H01L 23/5226* (2013.01)

(58) Field of Classification Search
CPC ........ C23F 4/00; C23F 1/44; H01L 21/76877; H01L 23/5226; H01L 23/53228; H01L 21/76802; H01L 21/76846; H01L 23/5283; H01L 21/76829; H01L 21/76834; H01L 21/76849; H01L 23/53295; H01L 21/76895; H01L 21/31116; H01L 21/76828; H01L 21/31144; H01L 21/02115; H01L 23/528; H01L 21/7685; H01L 21/7682; H01L 21/76897; H01L 21/76832; H01L 21/76883; H01L 21/0217
USPC ........ 257/751, 774, 529; 438/653, 675, 467, 438/618
See application file for complete search history.

(56) References Cited

U.S. PATENT DOCUMENTS

| | | |
|---|---|---|
| 5,891,513 A | 4/1999 | Dubin et al. |
| 6,143,645 A | 11/2000 | Hsu et al. |
| 7,086,138 B2 | 8/2006 | Anderson et al. |
| 7,514,361 B2 | 4/2009 | Bonilla et al. |
| 7,727,888 B2 | 6/2010 | Yang et al. |

(Continued)

*Primary Examiner* — Mouloucoulaye Inoussa
(74) *Attorney, Agent, or Firm* — Cantor Colburn LLP; Robert Sullivan (57) ABSTRACT

Back end of line metallization structures and methods for fabricating self-aligned vias. The structures generally include a first interconnect structure disposed above a substrate. The first interconnect structure includes a metal line formed in a first interlayer dielectric. A second interconnect structure overlies the first interconnect structure. The second interconnect structure includes a second cap layer on the first interlayer dielectric, a second interlayer dielectric thereon, and at least one self-aligned via in the second interlayer dielectric conductively coupled to at least a portion of the metal line of the first interconnect structure, wherein any misalignment of the at least one self-aligned via results in the at least one self-aligned via landing on both the metal line of the first interconnect structure and the second cap layer. The second cap layer is an insulating material.

7 Claims, 3 Drawing Sheets

(56) References Cited

U.S. PATENT DOCUMENTS

| | | | |
|---|---|---|---|
| 7,745,282 B2 | 7/2010 | Yang et al. | |
| 8,039,966 B2 | 10/2011 | Yang et al. | |
| 8,138,604 B2 | 3/2012 | Yang et al. | |
| 8,299,625 B2 | 10/2012 | Ponoth et al. | |
| 8,614,144 B2 | 12/2013 | Kato | |
| 9,324,650 B2 | 4/2016 | Edelstin et al. | |
| 9,818,640 B1 | 11/2017 | Stephens et al. | |
| 10,199,270 B2 | 2/2019 | Bombardier et al. | |
| 2002/0121699 A1 | 9/2002 | Cheng et al. | |
| 2014/0319650 A1* | 10/2014 | Coyner | H01L 21/76888 257/529 |
| 2015/0091181 A1* | 4/2015 | Li | H01L 21/76829 257/774 |
| 2016/0027738 A1* | 1/2016 | Murray | H01L 21/76832 257/751 |
| 2016/0329278 A1 | 11/2016 | Bouche et al. | |
| 2016/0379881 A1* | 12/2016 | He | H01L 21/76832 257/774 |
| 2017/0186682 A1* | 6/2017 | Anderson | H01L 21/76835 |
| 2017/0186743 A1* | 6/2017 | Chiou | H01L 29/785 |
| 2018/0138187 A1 | 5/2018 | Ogino | |
| 2019/0096819 A1* | 3/2019 | Chen | H01L 23/528 |

\* cited by examiner

INTERCONNECT STRUCTURES INCLUDING SELF ALIGNED VIAS

BACKGROUND

The present invention generally relates to semiconductor devices, interconnect structures, and fabrication methods. More particularly, the present invention relates to self-aligned via interconnect structures and methods for forming the self-aligned via structures to an underlying interconnect.

An integrated circuit (IC) generally includes a semiconductor substrate in which a number of device regions are formed by diffusion or ion implantation of suitable dopants. This substrate usually includes various configurations of passivating layers and insulating layers required to form different device regions. Openings through these layers (called vias or contact holes) allow electrical contact to be made selectively to the underlying device regions. A conducting material such as copper is used to fill these holes, which then make contact to the appropriate region of the semiconductor device.

Vias can be formed using a lithographic process. In an exemplary lithographic process, a photoresist layer is spin coated over a dielectric layer and subsequently exposed to actinic radiation through a patterned mask, which is developed in order to form an opening in the photoresist layer. An opening for the via can be etched in the dielectric layer by using the opening in the photoresist layer as an etch mask. This opening is referred to as a via opening.

SUMMARY

The present invention is generally directed to a semiconductor device, interconnect structures, and methods for forming a semiconductor device including the interconnect structure. In one or more embodiments of the invention, a method is provided for forming a self-aligned via in a second interconnect structure overlying a first interconnect structure, wherein the first interconnect structure includes a metal line formed in a first interlayer dielectric. The method for forming a self-aligned via in a second interconnect structure includes selectively depositing a first cap layer on only exposed surfaces of the metal line formed in the first interlayer dielectric. A second cap layer is blanket deposited onto the first interconnect structure. The second cap layer is planarized to the metal line, wherein the first cap layer is coplanar to the second cap layer. The first cap layer is selectively removed to form a recess exposing the metal line. A second interlayer dielectric is deposited and patterned to form a self-aligned via opening to at least a portion of the metal line. A misalignment of the self-aligned via opening results in the at least one self-aligned via opening landing on both the metal line of the first interconnect structure and the second cap layer.

In one or more embodiments of the invention, the semiconductor device includes an interconnect structure for an integrated circuit. More specifically, the semiconductor device can include a first interconnect structure disposed above a substrate. The first interconnect structure includes a metal line formed in a first interlayer dielectric. A second interconnect structure overlies the first interconnect structure and includes a second cap layer on the first interlayer dielectric, a second interlayer dielectric thereon, and at least one self-aligned via in the second interlayer dielectric conductively coupled to at least a portion of the metal line of the first interconnect structure. A misalignment of the at least one self-aligned via results in the at least one self-aligned via landing on both the metal line of the first interconnect structure and the second cap layer, wherein the second cap layer is an insulating material.

An interconnect structure for an integrated circuit in accordance with one or more embodiments of the invention includes a first interconnect structure disposed above a substrate, the first interconnect structure including a metal line formed in a first interlayer dielectric. A second interconnect structure is disposed above the first interconnect structure. The second interconnect structure includes a third cap layer selectively provided on only the metal line of the first interconnect structure, a second cap layer on the first interlayer dielectric and the third cap layer, wherein the third cap layer includes an insulating material or a metal material, and wherein the second cap layer is an insulating material, a second interlayer dielectric thereon, and at least one self-aligned via conductively coupled to at least a portion of the metal line of the first interconnect structure. A misalignment of the at least one self-aligned via results in the at least one self-aligned via conductively coupled to the metal line of the first interconnect structure and on the second cap layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Integrated circuit processing can be generally divided into front end of the line (FEOL), middle of the line (MOL) and back end of the line (BEOL) metallization processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact formation. Layers of interconnections are formed above these logical and functional layers during the BEOL metallization processing to complete the integrated circuit structure. As such, BEOL metallization processing generally involves the formation of insulators and conductive wiring.

The present invention generally relates to BEOL structures and processes for forming a self-aligned via to an underlying metal interconnect. When patterning extremely small vias with extremely small pitches by such lithographic processes, several challenges present themselves. One such challenge is that the overlay between the vias and the underlying and overlying interconnects generally needs to be controlled to high tolerances. As via pitches scale ever smaller over time, the overlay tolerances tend to scale with them at an even greater rate than lithographic equipment is able to keep up. For example, without self-aligned via (SAV) processes, the dielectric space between copper lines and vias can become small and cause reliability issues. Any partially landed vias presented in the structure can degrade interconnect reliability.

One prior art process of a trench-first metal hardmask self-aligned via (SAV) scheme introduced at the 32 nm node helped to mitigate the orthogonal Vx to Mx+1 spacing, wherein V represents a via level and M represents a metal line level and x is a whole integer. However, prior art SAV schemes do not address the parallel (non-SAV) Vx alignment to Mx below. In one or more embodiments of the present invention, the self-aligned via structures and methods of forming the self-aligned via structure to a lower metal layer are provided in both the orthogonal and parallel directions.

Detailed embodiments of the integrated circuit including at least one top via integration scheme aligned in both the orthogonal and parallel directions and methods for fabricating the multiple levels of interconnect structures according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "about," "substantially," and equivalents thereof modifying the quantity of an ingredient, component, or reactant of the invention employed, or modifying any other quantity or dimension, refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments of the invention, several dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

FIGS. 1-8 schematically illustrate cross sectional views of various BEOL metallization structures and process flows for forming a self-aligned via in the back end of line metallization structure for an integrated circuit in accordance with one or more aspects of the present invention. The structures and methods utilize a top via integration scheme to provide alignment in both the orthogonal and parallel directions of the Mx and Mx+1 features.

Figure 1:
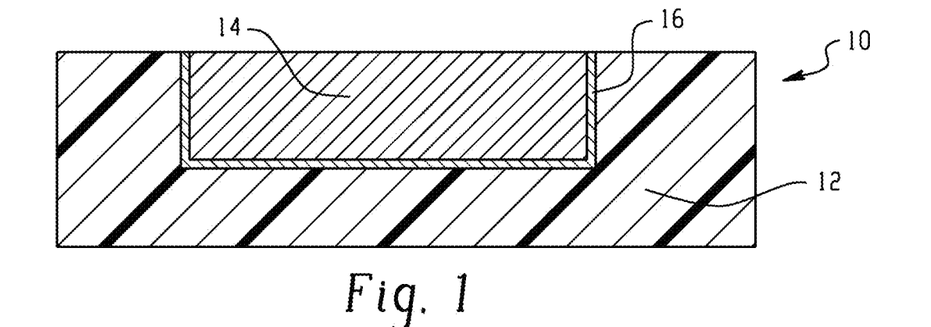
FIG. 1 illustrates a cross-sectional view of an exemplary semiconductor device including a first interconnect structure including in accordance with one or more embodiments of the present invention.

In FIG. 1, there is shown a cross sectional view of a portion of a first interconnect structure 10 including an interlayer dielectric 12 and a wiring structure 14 formed within the interlayer dielectric 12. The first interconnect structure 10 can be formed on a substrate (not shown). The substrate is not intended to be limited and can represent front end of line (FEOL) components. FEOL generally refers to the construction of the components of the IC directly inside the wafer.

In one or more embodiments of the invention, the interlayer dielectric 12 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organo silicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The dielectric layer can be deposited by PECVD procedures as is generally known in the art.

In one or more embodiments of the invention, the interlayer dielectric 12 can be an ultra-low k (ULK) dielectric. The ULK dielectric can have a dielectric constant of up to about 3, meaning a dielectric constant of greater than zero up to about 3, such as a dielectric constant ranging from about 1.5 to about 3.0, and in one or more embodiments of the invention, can have a dielectric constant of less than about 2.5. The ULK dielectric typically contains pores having characteristic dimensions ranging from about 0.5 nanometers to about 10 nanometers, such as from about 0.5 nanometers to about 2 nanometers.

Exemplary ULK dielectrics can include porous inorganic materials such as, for example, silicon-containing materials such as compositions of Si, C, O, and H, including (SiCOH), also called C doped oxide (CDO) or organosilicate glass (OSG). The ULK dielectrics deposited by plasma enhanced chemical vapor deposition (PECVD), or by spin coating methods. Specific examples of PECVD ULK dielectrics include, but are not limited to, Black Diamond porous SiCOH (BDII, BDIII) from Applied Materials, and ULK or ELK Aurora from ASM.

A variety of spin applied films having the composition Si, C, O, H, such as, methylsilsesquioxanes, siloxanes can also be used. The materials known as Orion and other materials from Trikon and the material known as Zircon from Shipley can also be used.

In one or more embodiments of the invention, the ULK dielectric can be a porous low-k organic material such as the commercially available porous organic thermoset from Dow Chemical Co. sold under the tradename porous SiLK, or polyarylene ethers, and the like.

The wiring structure 14 is formed within the dielectric layer 12 can be formed using lithography, etching, and deposition processes. For example, the formation of the wiring structure 14 begins with the deposition and patterning of a photoresist on the interlevel dielectric layer 12. The photoresist is patterned by exposure to energy (light) to form a pattern (openings), which corresponds to the dimensions of the wiring structure 14. A reactive ion etching (RIE) process is performed through the photoresist pattern to form a trench feature. The photoresist can then be removed using conventional etchants and/or stripping techniques, e.g., oxygen ashing.

The photoresist can be composed of a material suitable for use in a lithographic process. In other words, in some embodiments of the invention, the photoresist layer is exposed to a light source and subsequently developed. In some embodiments of the invention, the portions of the photoresist layer to be exposed to the light source will be removed upon developing the photoresist layer, e.g., the photoresist layer is composed of a positive photoresist material. In some embodiments of the invention, the photoresist layer is composed of a positive photoresist material such as, but not limited to, a 248 nanometer node resist, a 193 nanometer node resist, a 157 nanometer node resist, an extreme ultra-violet (EUV) resist, or a phenolic resin matrix with a diazonaphthoquinone sensitizer. In one or more embodiments of the invention, the portions of the photoresist to be exposed to the light source will be retained upon developing the photoresist layer, e.g., the photoresist layer is composed of a negative photoresist material.

A barrier/liner material 16 is formed within the opening. In embodiments of the invention, the barrier/liner material 16 can be a combination of a barrier metal or metal alloy material and a liner metal or metal alloy material. In embodiments of the invention, the barrier/liner material 16 is deposited using either plasma vapor deposition (PVD), chemical vapor deposition (CVD) or atomic layer deposition (ALD) processes. In embodiments of the invention, the barrier material 16 can be tantalum nitride (TaN) or titanium nitride (TiN) with the liner material being Ta or Ti, respectively, or Co.

An optional seed layer is deposited on the barrier/liner material 16 followed by a deposition of wiring metal to form the wiring structure 14. The optional plating seed layer can be employed to selectively promote subsequent electroplating of a pre-selected conductive metal or metal alloy. The optional plating seed layer can include Cu, a Cu alloy, Jr, an Jr alloy, Ru, a Ru alloy (e.g., TaRu alloy) or any other suitable noble metal or noble metal alloy having a low metal-plating overpotential. Typically, Cu or a Cu alloy plating seed layer is employed, when a Cu metal is to be subsequently formed within the at least one opening. In one or more embodiments of the invention, other metal materials can also be used for the wiring structure 14.

The thickness of the optional seed layer can vary depending on the material of the optional plating seed layer as well as the technique used in forming the same. Typically, the optional plating seed layer has a thickness from 2 nm to 80 nm. The optional plating seed layer can be formed by a conventional deposition process including, for example, CVD, PECVD, ALD, and PVD.

Still referring to FIG. 1, any residual barrier/liner material 16 and metal material for forming the wiring structure 14, i.e., overburden, can be removed from the upper surface of the interlevel dielectric layer 12 using a chemical mechanical polishing (CMP) process. The CMP process can also be used to planarize the wiring structure 14 and the interlevel dielectric layer 12 for subsequent processing such that the uppermost respective surfaces are coplanar to one another as shown.

Figure 2:
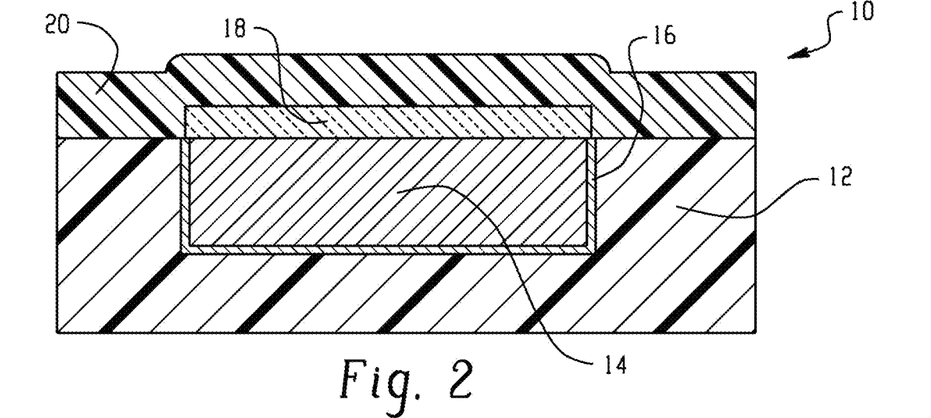
FIG. 2 illustrates a cross-sectional view of the exemplary semiconductor device of FIG. 1 after selective deposition of a first cap layer onto the wiring structure of the first interconnect structure and deposition of a second cap layer on the substrate in accordance with one or more embodiments of the present invention.

Turning now to FIG. 2, a first cap layer 18 is selectively deposited onto the exposed surfaces of the wiring structure 14. The first cap layer 18 is not provided on the exposed surfaces of the interlayer dielectric 12, thereby forming a raised surface of the first cap layer 18 relative to the uppermost surface of the interlayer dielectric 12. A second cap layer 20 is then blanket deposited onto the structure 10, wherein the first cap layer 18 is of a different material and has a different etch selectivity than the second cap layer 20.

In one or more embodiments of the invention, the first cap layer 18 can be an insulative material or a metal material. An exemplary insulator is a low k dielectric material such as, for example, NBLok and an exemplary metal layer is cobalt (W, P, B), ruthenium, Ta(N), or the like. The thickness of the first cap layer 18 can range from 2 nm to 6 nm.

The second cap layer 20 can be a dielectric material such as, for example, SixNy, SiC, SiCxNyHz, SiCHN, SiCOH or similar dielectric material, such as, for example, NBLoK, $Al_2O_3$, flowable oxide, tetraethyl orthosilicate, polyimide, or the like provided the dielectric material is different from the insulative materials, if present, selected for the first cap layer 18.

Figure 3:
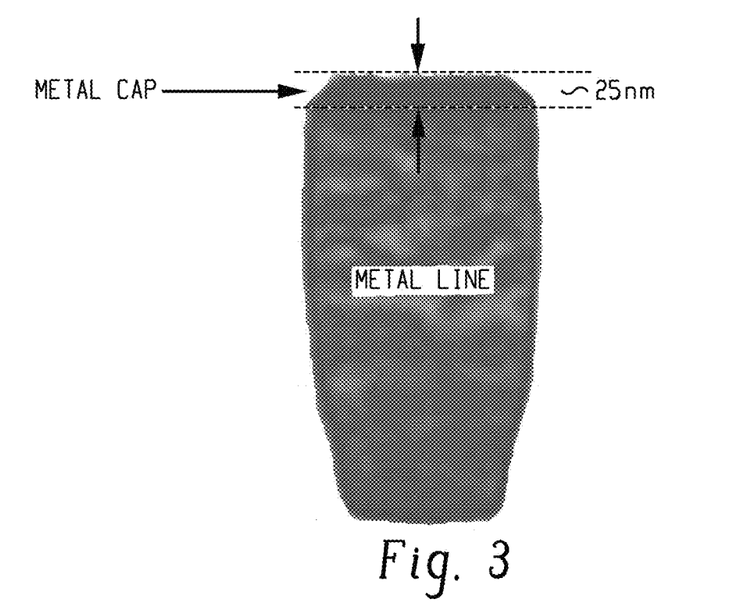
FIG. 3 pictorially illustrates a scanning electron micrograph cross section of the first interconnect structure of FIG. 2 in accordance with one or more embodiments of the present invention.

FIG. 3 pictorially illustrates a cross sectional scanning electron micrograph of the first interconnect structure of FIG. 2 including the wiring structure 14 within the interlayer dielectric 12, wherein the first and second cap layers 18, 20, respectively are provided on the first interconnect structure as described above. As noted, the first cap layer can be a metal cap layer having a thickness of about 25 nanometers. However, it should be apparent that other thicknesses can be used and that in one or more embodiments of the invention, the first cap layer 18 can optionally be a metal material.

Figure 4:
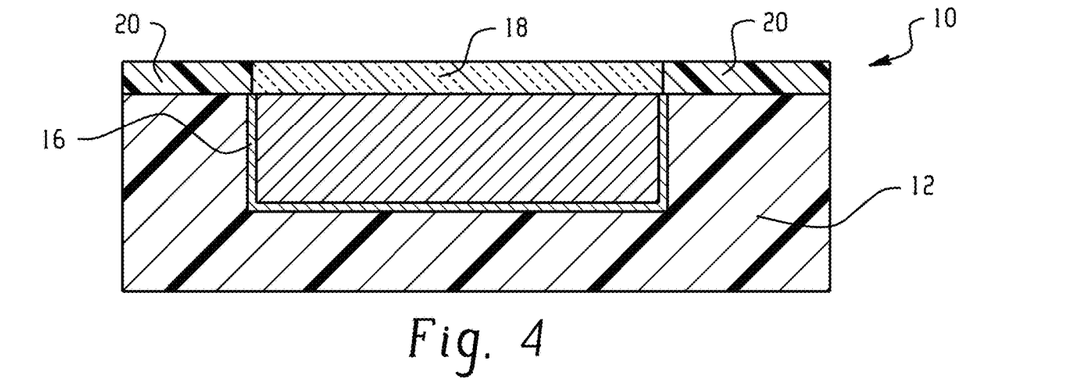
FIG. 4 depicts a cross-sectional view illustrating the exemplary semiconductor device of FIG. 2 after planarization such that the first and second cap layers are coplanar to one another in accordance with one or more embodiments of the present invention.

Referring now to FIG. 4, the BEOL metallization structure 10 is subjected to a planarization process stopping on the first cap layer 18 such that the uppermost surfaces of the first and second cap layers 18, 20, respectively, are coplanar to one another. An exemplary planarization process is a chemical mechanical polishing process (CMP).

Figure 5:
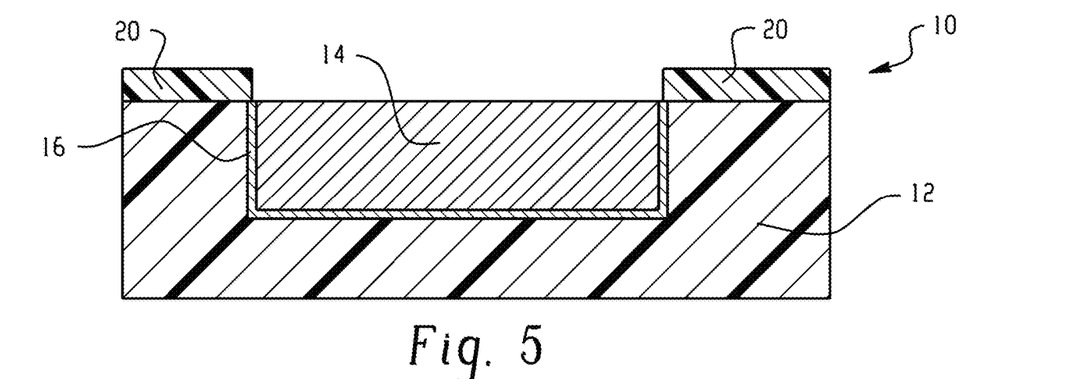
FIG. 5 depicts a cross-sectional view illustrating the exemplary semiconductor device of FIG. 4 after selective removal of the first cap layer from the wiring structure of the first interconnect structure so as to form a recess relative to the second cap layer in accordance with one or more embodiments of the present invention.

In FIG. 5, the first cap layer is selectively removed. Selective removal of the first cap layer relative to the second cap layer can include an etching process. The etching process can be a dry etching process or a wet etching process depending on the materials defining the first and second cap layers.

As used herein, the term "wet etching" generally refers to application of a chemical solution. In contrast, the term "dry etching" is used here to denote an etching technique such as reactive-ion-etching (RIE), ion beam etching, plasma etching or laser ablation. During the etching process, the pattern can be first transferred using a photoresist to a dielectric layer. The patterned photoresist is typically, but not necessarily, removed from the structure after the pattern has been transferred into the dielectric film. Optionally, the first cap material can be selectively removed using a wet etching process, for example, that is selective to the material (e.g., metal or insulative material) used to define the first cap layer 18 relative to the material (e.g., insulative material) used to define the second cap layer 20 and underlying metal utilized for the wiring structure 14.

Figure 6:
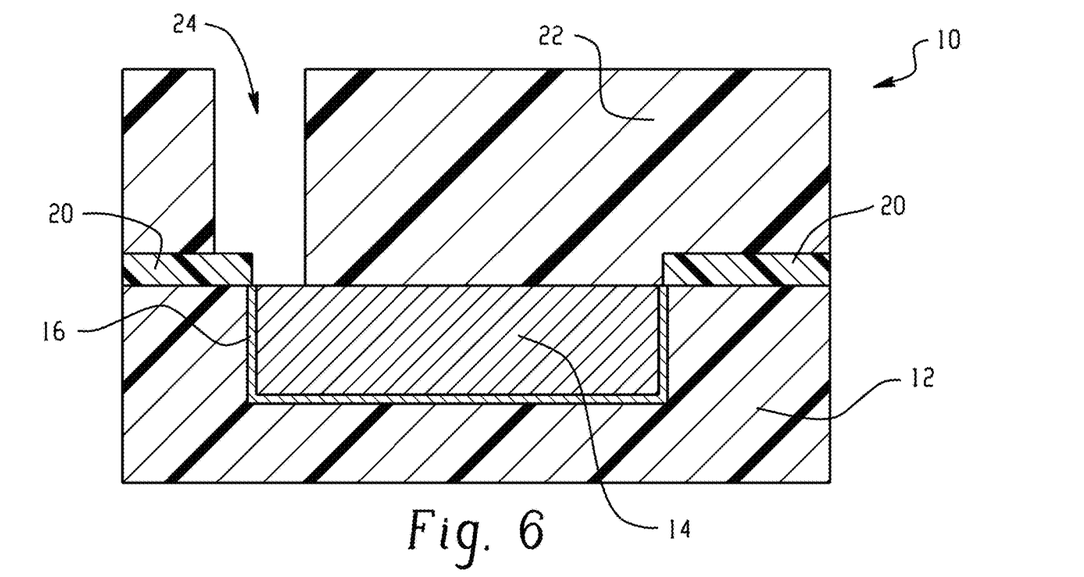
FIG. 6 depicts a schematic cross-sectional view illustrating the exemplary semiconductor device of FIG. 5 after deposition and patterning a second interlayer dielectric to form a self-aligned via at least partially landing on the wiring structure in accordance with one or more embodiments of the present invention.

In FIG. 6, a second interlayer dielectric layer 22 is deposited onto the BEOL metallization structure 10 and lithographically patterned to form a self-aligned via opening 24 to the underlying wiring structure 14. The self-aligned via opening can be formed using a directional etching process such as reactive ion etching. By way of example, $CF_4$, $CHF_3$, $C_xH_yF_z/N_2$ process gases can be used in the directional etching process. As shown, the self-aligned via opening 24 partially lands on the wiring structure 14 but is stopped on the second cap layer 20. The second capping layer 20 serves to prevent undesirable diffusion of the underlying wiring structure 14 into dielectric layer 12, which improves reliability of the interconnect structure.

As shown, the self-aligned via opening is offset relative to the underlying wiring structure 14 and partially lands on the wiring structure 14. The offset pattern refers to misalignment with the openings in the metal hard mask layer that is typically used to form the self-aligned via opening. The offset pattern depicted can represent an offset tolerance with the fabrication of commercial wafers. Or, in another case, the offset can be intentionally formed for the sake of optimizing a self-aligned via etch with hard mask selectivity.

Figure 7:
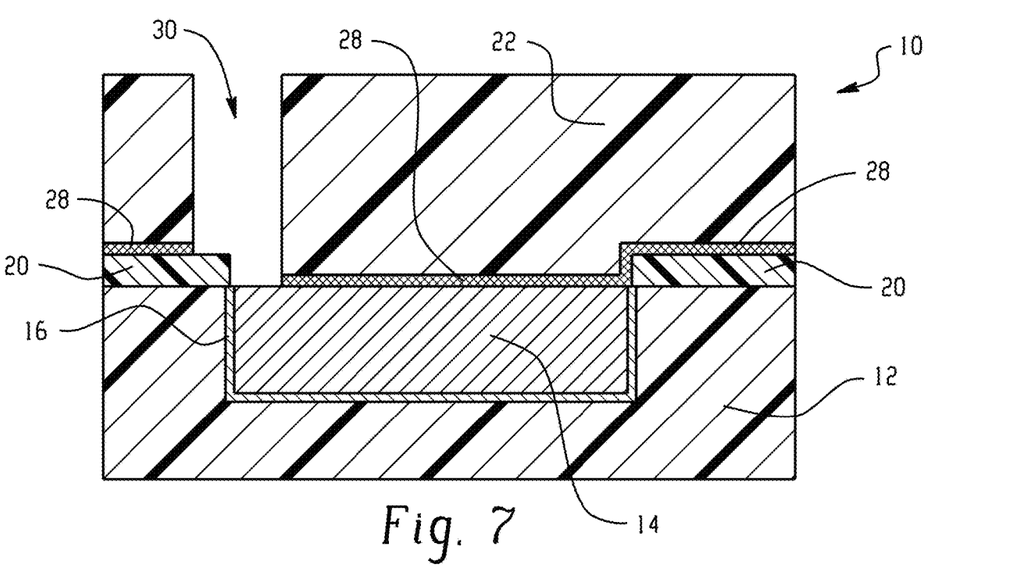
FIG. 7 depicts a schematic cross-sectional view of the exemplary semiconductor device of FIG. 5 after deposition and patterning a second interlayer dielectric to form a self-aligned via at least partially landing on the wiring structure in accordance with one or more embodiments of the present invention.

In one or more embodiments of the invention as shown in FIG. 7, a third cap layer 28 is conformally deposited onto the BEOL metallization structure 10 subsequent to selective removal of the first cap layer 18 shown in FIG. 5. That is, a relatively thin layer of the third cap layer 28 (relative to the thickness of the first cap layer 18 initially deposited as discussed in relation to FIG. 2) is conformally deposited onto the topography defined by the non-planar surfaces of the second cap layer 20 and the wiring structure 14. In one or more embodiments of the invention, the third cap layer 28 is an insulating material such as, for example, SiC, SiN, SiC (N,H) or the like. The second interlayer dielectric layer 22 is then deposited onto the BEOL metallization structure 10 and lithographically patterned to form a self-aligned via opening 30 to the underlying wiring structure 14. The self-aligned via opening 30 can be formed using a directional etching process such as reactive ion etching as previously described. Using a hard mask (not shown) patterned on the second interlayer dielectric 22, the self-aligned via directional etching process is configured to selectively remove exposed portions of the second dielectric 22 and the insulative third cap layer 28 at the bottom of the via opening 30, thereby exposing a portion of the wiring structure 14 and a portion of the second cap layer 20 as a result of lateral misalignment to the wiring structure 14. As such, the via opening 24 partially lands on the wiring structure 14 but is stopped on the second cap layer 20. The presence of the second cap layer 20 at the bottom of the via opening 30 prevents degradation of the interconnect connection and enables self-alignment of the via opening 30 landing on at least a portion of the wiring structure 14, which is subsequently filled with a suitable conductor. Additionally, the presence of the second cap layer 20 prevents undesirable diffusion of the underlying wiring structure 14 or the metal filled self-aligned via into dielectric layer 12. Moreover, the presence of the third cap layer 28 on the wiring structure 14 prevents diffusion into the interlayer dielectric 22.

Figure 8:
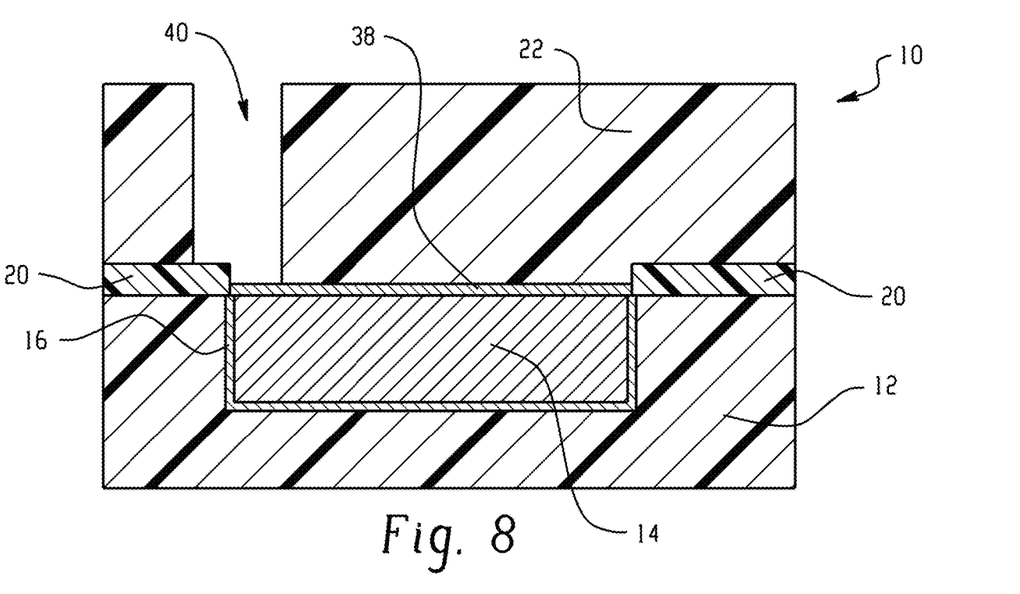
FIG. 8 illustrates a cross sectional view of the exemplary semiconductor device of FIG. 5 after deposition and patterning a second interlayer dielectric to form a self-aligned via at least partially landing on the wiring structure in accordance with one or more embodiments of the present invention.

In one or more embodiments of the invention as shown in FIG. 8, a metal cap layer 38 such as, for example, ruthenium, cobalt, tungsten, alloys thereof or the like, is selectively deposited onto the wiring structure 14 subsequent to selective removal of the first cap layer 18 as previously described and shown in FIG. 5. The second interlayer dielectric layer 22 is then deposited onto the BEOL metallization structure 10 and lithographically patterned to form a via opening 40 to the underlying wiring structure 14. The via opening 40 can be formed using a directional etching process such as reactive ion etching as previously described. Using a hard mask (not shown) patterned on the second interlayer dielectric 22, the directional etching process is configured to selectively remove exposed portions of the second dielectric 22 and the exposed surface of the metal cap layer 38 at the bottom of the via opening 40 that had been selectively deposited onto the wiring structure, thereby exposing a portion of the wiring structure 14 and a portion of the second cap layer 20 as a result of lateral misalignment to the wiring structure 14. As such, the self-aligned via opening 40 partially lands on the wiring structure 14 but is stopped on the second cap layer 20. The presence of the second cap layer 20 at the bottom of the via opening 40 prevents degradation of the interconnect connection and enables self-alignment of the via opening 30 landing on at least a portion of the wiring structure 14, which is subsequently filled with a suitable conductor. The presence of the second cap layer 20 prevents undesirable diffusion of the underlying wiring structure 14 or the metal filled self-aligned via into dielectric layer 12. Moreover, the presence of the third cap layer 28 formed of ruthenium, cobalt, tungsten, alloys thereof or the like on the wiring structure 14 prevents diffusion into the interlayer dielectric 22.

Depending on the BEOL structure, the capping layers 18, 20, 28, 38 can protect the underlying metal conductive line 14 from oxidation, humidity, and contamination during processing of the next metal levels on the semiconductor wafer 10. Additionally, capping layer serves to prevent undesirable diffusion of the underlying conductive line 14 into interlayer dielectric 12, 20. Still further, the structures and process including the self-aligned vias overcomes some of the challenges in the prior art and improves overlay tolerance by eliminating any issues related to misalignment of the self-aligned vias to the wiring structure. So long as the self-aligned vias partially land on the wiring structure, reliability is not impacted, and any issues related to orthogonal and parallel alignment of the self-aligned vias are minimized.

All ranges described herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the preferred embodiment to the invention has been described, it will be understood that those skilled in the art, both now and in the future, can make various improvements and enhancements which fall within the scope of the claims which follow. These claims should be construed to maintain the proper protection for the invention first described.

What is claimed is:

1. A method for forming a self-aligned via in a second interconnect structure overlying a first interconnect structure, wherein the first interconnect structure includes a metal line formed in a first interlayer dielectric, the method comprising:
    selectively depositing a first cap layer on only exposed surfaces of the metal line formed in the first interlayer dielectric;
    blanket depositing a second cap layer onto the first interconnect structure;
    planarizing the second cap layer to the first cap layer, wherein the first cap layer is coplanar to the second cap layer;
    selectively removing the first cap layer to form a recess exposing the metal line; and
    depositing and patterning a second interlayer dielectric to form a self-aligned via opening to at least a portion of the metal line, wherein a misalignment of the self-aligned via opening results in the at least one self-aligned via opening landing on both the metal line of the first interconnect structure and the second cap layer, wherein a portion of the second interlayer dielectric is immediately over the metal line, the portion of the second interlayer dielectric having a bottom surface below a top surface of the second cap layer such that a sidewall face of the second cap layer and a sidewall face of the portion of the second interlayer dielectric are directly opposite one another with the at least one self-aligned via opening in between.

2. The method of claim 1, wherein the first and/or second interlayer dielectric is an ultra-low k dielectric having a dielectric constant (k) of less than about 3.0 to about 1.5.

3. The method of claim 1, wherein the second cap layer comprises a silicon nitride, a silicon dioxide, a silicon carbide, or an aluminum nitride.

4. The method of claim 1, wherein the second cap layer comprises SiN, SiC, or SiC (N,H).

5. The method of claim 1, wherein the first cap layer comprises ruthenium, cobalt, tungsten, alloys thereof, or combinations thereof.

6. The method of claim 1 further comprising conformally depositing a third cap layer prior to depositing the second interlayer dielectric, wherein the third cap layer comprises an insulating material and is at a fraction of a thickness of the first cap layer.

7. The method of claim 1 further comprising selectively depositing a third cap layer prior to depositing the second interlayer dielectric onto only the metal line, wherein the third cap layer comprises a metal material and is at a fractional thickness of the first cap layer, wherein the self-aligned via opening lands on the third cap layer and on the second cap layer upon the misalignment such that the third cap layer is on an uppermost surface of the metal line in the first interconnect in its entirety.

* * * * *